United States Patent
Thylén et al.

(10) Patent No.: US 6,801,147 B2
(45) Date of Patent: Oct. 5, 2004

(54) OPTICAL SYSTEM AND METHOD FOR PERFORMING ANALOG TO DIGITAL CONVERSION

(75) Inventors: Lars Thylén, Huddinge (SE); Sverker Hård, Göteborg (SE); Urban Westergren, Stockholm (SE); Mehran Mokhtari, Thousand Oaks, CA (US)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 285 days.

(21) Appl. No.: 10/074,199

(22) Filed: Feb. 12, 2002

(65) Prior Publication Data

US 2002/0175845 A1 Nov. 28, 2002

Related U.S. Application Data

(63) Continuation of application No. PCT/SE00/01561, filed on Aug. 10, 2000.

(30) Foreign Application Priority Data

Aug. 12, 1999 (SE) .............................................. 9902909

(51) Int. Cl.[7] .............................................. H03M 1/00
(52) U.S. Cl. ..................................... 341/137; 359/237
(58) Field of Search ................................ 341/137, 155; 359/237, 245, 558

(56) References Cited

U.S. PATENT DOCUMENTS

| | | | |
|---|---|---|---|
| 4,185,274 A | | 1/1980 | Giallorenzi .................. 341/13 |
| 4,395,702 A | | 7/1983 | Gottlieb et al. ............. 341/111 |
| 4,571,576 A | | 2/1986 | Olsson et al. ............... 341/137 |
| 5,459,707 A | * | 10/1995 | Morimoto .................... 369/14 |
| 5,638,353 A | * | 6/1997 | Takahashi .............. 369/112.07 |
| 6,409,198 B1 | * | 6/2002 | Weimer et al. ........ 250/339.04 |
| 6,420,984 B1 | * | 7/2002 | Robertson .................... 341/137 |
| 6,420,985 B1 | * | 7/2002 | Toughlian et al. .......... 341/137 |
| 6,526,079 B1 | * | 2/2003 | Watterson et al. ............ 372/32 |
| 6,661,361 B1 | * | 12/2003 | Lewis et al. ................. 341/137 |

FOREIGN PATENT DOCUMENTS

| | | |
|---|---|---|
| EP | 0042999 A2 | 1/1982 |
| JP | 57-176026 A | 10/1982 |
| JP | 58-153921 A | 9/1983 |
| JP | 62-159129 A | 7/1987 |
| JP | 10-028055 A | 1/1998 |

* cited by examiner

Primary Examiner—Peguy JeanPierre

(57) ABSTRACT

An opto-electronic A/D converter includes a tunable laser for wavelength modulating a narrowband coherent electromagnetic beam by the amplitude of the analog signal. A grating transforms the wavelength modulated beam into a corresponding angularly modulated beam. A set of kinoforms diffract the angularly modulated beam into a bundle of diffracted beams. Detectors determine the digital signal by repeatedly sampling the spatial power distribution of the diffracted beams.

12 Claims, 5 Drawing Sheets

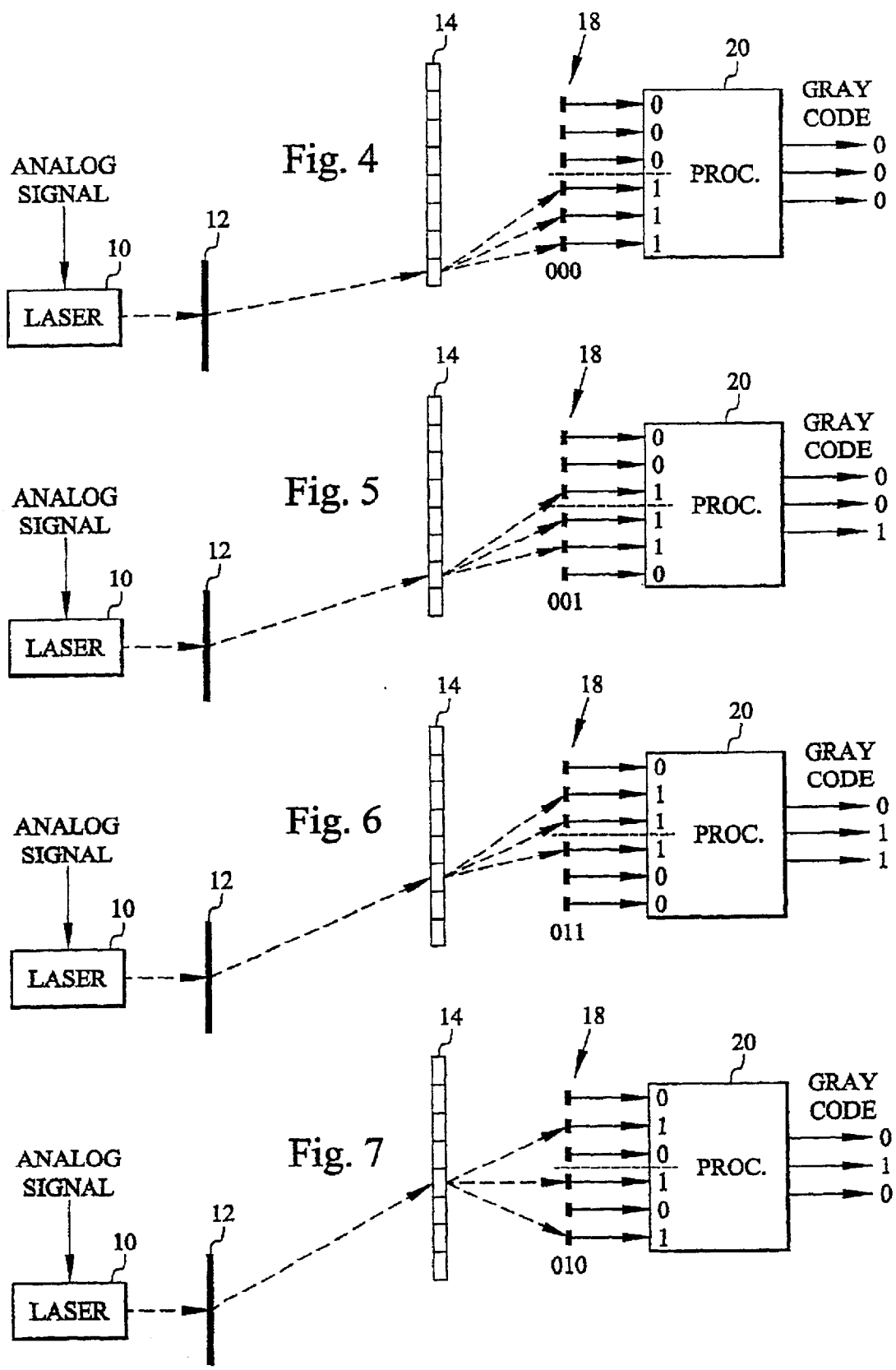

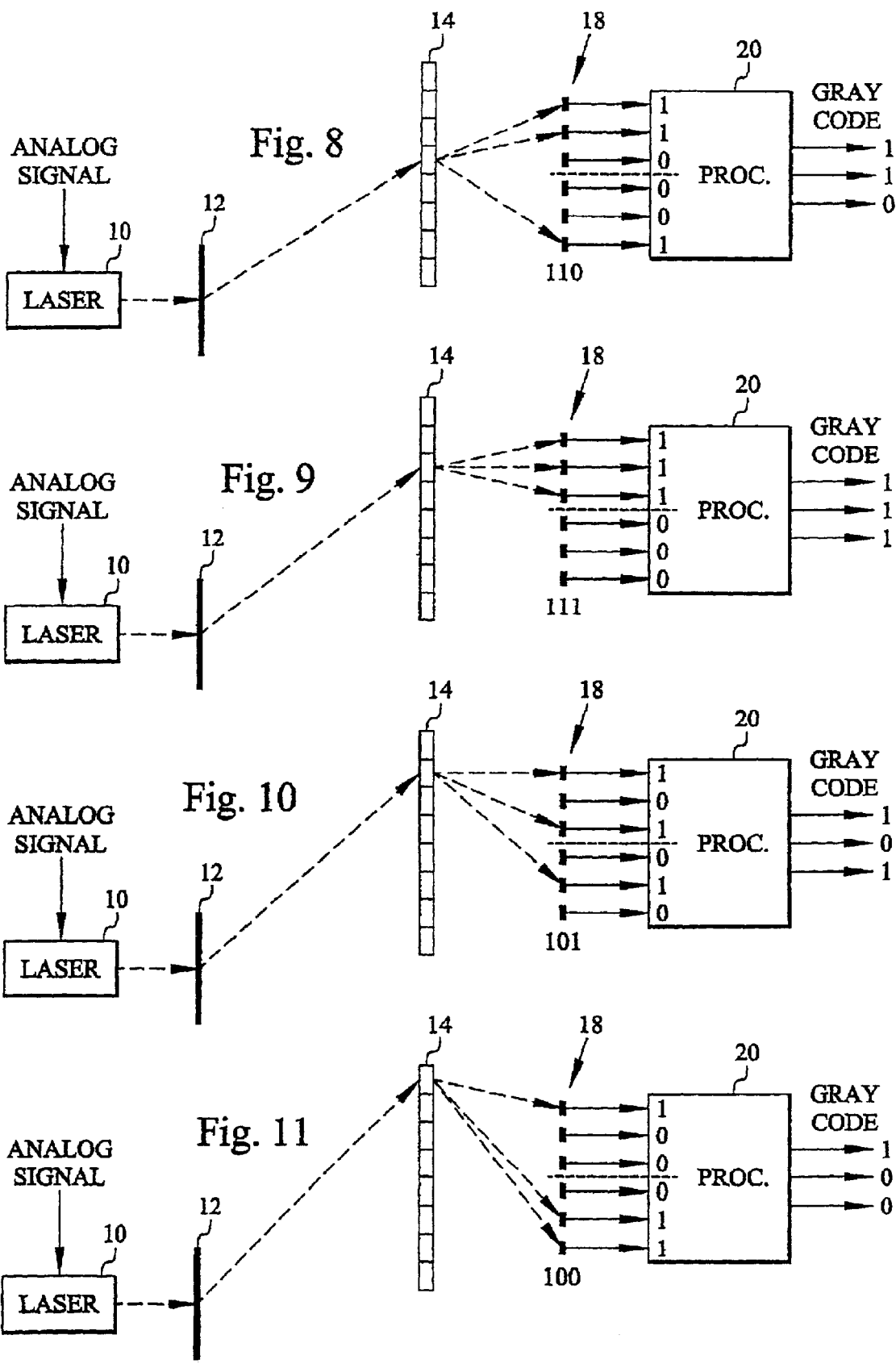

OPTICAL SYSTEM AND METHOD FOR PERFORMING ANALOG TO DIGITAL CONVERSION

CROSS REFERENCE OF PREVIOUS APPLICATIONS

This application is a continuation of Application PCT/SC00/01561 filed Aug. 10, 2000.

TECHNICAL FIELD

The present invention generally relates to A/D conversion, and in particular to a high sampling rate A/D conversion method and apparatus.

BACKGROUND

The development of, for example, telecommunication systems demands A/D conversion at increasingly higher sampling rates. Modern fast electronic A/D converters typically operate at a sampling rate of the order of 50 Mega samples per second, which is much lower than the desired sampling rate of the order of 1 Giga samples per second or higher. Optical solutions for A/D conversion have been suggested to increase the sampling rate. One example is a method involving banks of Mach-Zender interferometers, see [1]. However, the necessary modulators have been considered to be too bulky. Furthermore, this method creates problems with regard to electrical crosstalk between the modulators. Other disadvantages include that the terminations consist of a bank of capacitors connected in parallel and that a pulsed light source is required.

Reference [2] describes an arrangement that converts a voltage into an angle and subsequently converts the angle into a binary pattern. The voltage-angle conversion relies on mechanical, acoustic or electro-optical devices. This severely limits the obtainable conversion rate. Furthermore, the conversion from angle to binary signal is performed by a bulky optical system that is unsuitable for integration.

Another approach has been a complicated arrangement to "time stretch" the analog signal using chirped optical pulsing, see [3].

SUMMARY

An object of the present invention is to provide an opto-electronic A/D converting method and apparatus that avoid these problems and are capable of high speed A/D conversion.

This object is achieved in accordance with the attached claims.

Briefly, the present invention involves a tunable laser, the wavelength of which is modulated by the analog signal. The modulated laser beam passes through a grating, which produces a deflected beam. The angle of deflection corresponds to the amplitude of the analog signal. The deflected beam impinges on a specific kinoform in a kinoform array. The impinged kinoform produces a corresponding bundle of beams that is directed to an array of photo detectors. Each kinoform in the array produces a different bundle of beams, and each bundle corresponds to a different digital value. The power distribution on the array of photo detectors is sampled to determine the digital value.

The described arrangement has several advantages:
1. It is possible to achieve A/D conversion at very high sampling rates, more than 1 Giga samples per second for a resolution of 6–8 bits.
2. Several vital elements used for the actual A/D conversion (grating and kinoforms) are stable passive elements that are not sensitive to sampling frequency.
3. The A/D converter itself has a low power consumption (about 10 mW for the laser and 10 mW per digital bit).
4. The actual A/D converter is small, typically less than 20×4×1 mm.

BRIEF DESCRIPTION OF THE DRAWINGS

The invention, together with further objects and advantages thereof, may best be understood by making reference to the following description taken together with the accompanying drawings, in which:

FIGS. 4–11 illustrate the behavior of the embodiment of FIG. 3 for different analog input signal amplitudes;

DETAILED DESCRIPTION

In the following description only elements necessary to explain the basic principles of the present invention will be described. Other elements that will typically be used in a practical implementation, such as lenses, have been omitted.

Furthermore, elements performing the same or similar functions have been provided with the same reference designations.

In order to distinguish between optical and electrical signals, optical signals are represented by dashed lines and electrical signals are represented by solid lines in the figures.

Figure 1:
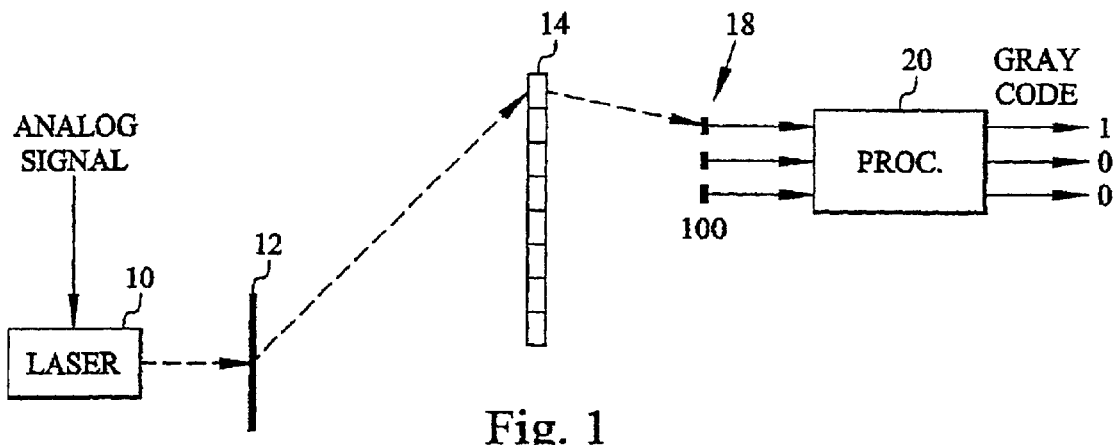
FIG. 1 is a schematic diagram illustrating an embodiment of an apparatus in accordance with the present invention.

FIG. 1 is a schematic diagram illustrating an embodiment of an apparatus in accordance with the present invention. A tunable laser 10 (tunable lasers are described in [4]) is wavelength (or frequency) modulated by the amplitude of an analog signal that is to be digitized. The modulated laser beam is directed to a grating 12 (grating 12 may be replaced by an arrayed waveguide grating or a dispersive element in general). The grating will deflect the modulated laser beam in different directions, depending on the wavelength shift produced by the analog signal. The deflected beam from grating 12 reaches a set 14 of diffractive elements, for example a set of kinoforms (kinoforms are described in [5–6]). Each diffractive element produces, when impinged by a deflected beam, a different bundle of outgoing beams, and each beam bundle corresponds to a different digital value. The diffracted beams are directed towards an array 18 of photo detectors, for example PIN/nsn photo detectors), and the combination of activated photo detectors will correspond to the decoded digital value. The actual decoding of the digital value is performed by a processing unit 20, which will be described in further detail below.

In FIG. 1 there are 3 photo detectors 18, which corresponds to a resolution of 3 bits or 8 levels. Consequently there are 8 diffractive elements 14. In a general case there are $2^n$ diffractive elements 14 for a solution of n bits. In an n-bit embodiment corresponding to FIG. 1 there would be n photo detectors 18.

In order to minimize erroneous decoding when a beam partially impinges on 2 neighboring diffractive elements 14, it is preferred to use Gray code instead of ordinary binary code during the digitizing phase, since neighboring Gray codes only differ by 1 bit. Thus, if an erroneous decision is made, the quantized signal will at most have an error of 1 bit. This feature will be further described below.

In FIG. 1 the uppermost diffractive element 18 is impinged by a deflected beam. This element corresponds to the largest wavelength and thus to the largest amplitude of the analog signal. This largest amplitude is represented by quantization level 8, which corresponds to the Gray code 100. Thus, the uppermost diffractive element will produce a beam that impinges on only one of the photo detectors 18.

Figure 2:
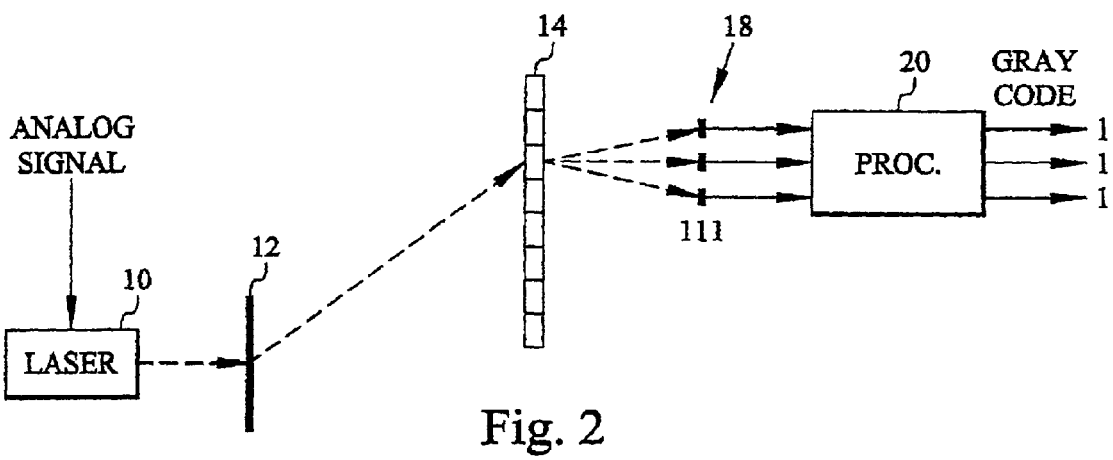
FIG. 2 is a is a diagram similar to FIG. 1, but with another analog input signal amplitude.

In FIG. 2 an analog signal corresponding to quantization level 6 requires a diffractive element 14 that has to illuminate all three photo detectors, since quantization level 6 corresponds to the Gray code 111.

Figure 3:
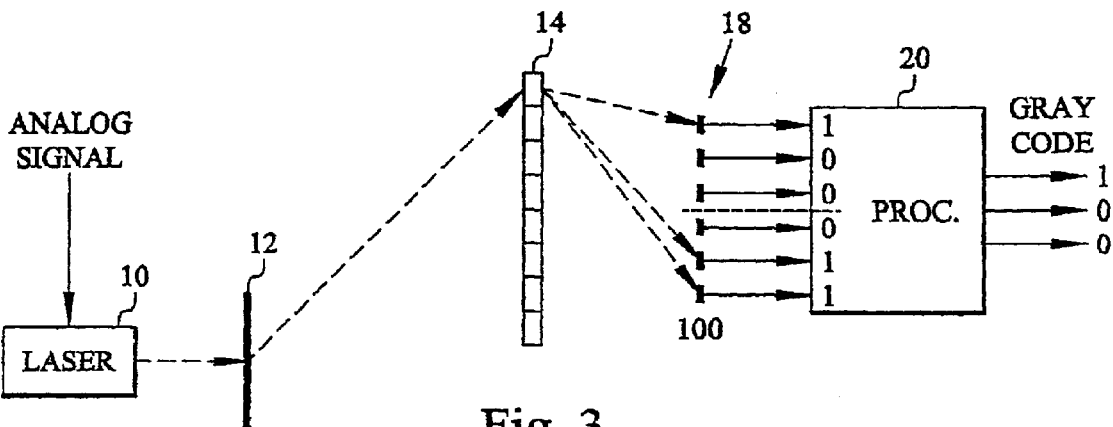
FIG. 3 illustrates another embodiment of an apparatus in accordance with the present invention.

As illustrated by FIGS. 1 and 2, the described embodiment requires a different number of diffracted beams to produce different Gray codes. This means that the power from one diffractive element 14 is distributed over several photo detectors 18, while another diffractive element may distribute the same power on only one photo detector. This arrangement may lead to difficulties in setting proper detection thresholds in processing unit 20 for very high sampling rates (>100 Giga samples per second) and high resolutions (n>10). FIG. 3 illustrates another embodiment of an apparatus in accordance with the present invention that avoids this potential problem.

In the embodiment of FIG. 3 the number of photo detectors in set 18 has been doubled. The upper 3 photo detectors detect the actually desired Gray code, while the lower 3 photo detectors detect its 2-complement (1-bits replaced by 0-bits and vice versa). With this arrangement each diffractive element 14 will always produce 3 beams (n beams in the general case) when impinged by a deflected laser beam. This will guarantee that each Gray code is detected in the same way and reduce the probability of erroneous decoding of the photo detectors.

FIGS. 4–11 illustrate the behavior of the embodiment of FIG. 3 for different analog input signal amplitudes. These figures illustrate the beam bundles that are produced for all the possible 8 quantization levels. It is noted that each diffractive element produces a 3 beam pattern, as stated above. It is also noted that for every quantization level all beams are always directed towards photodetectors.

Figure 12:
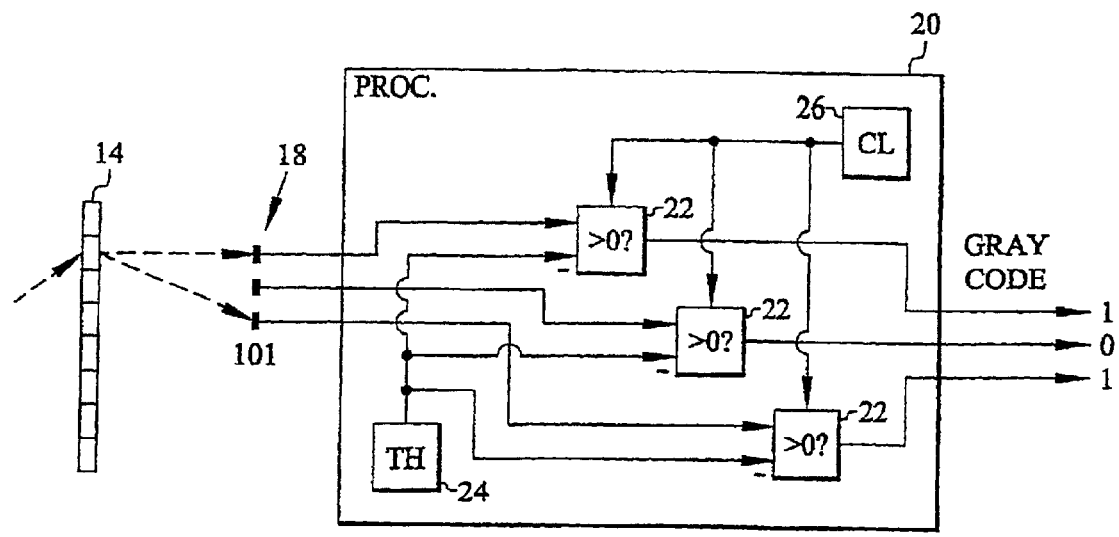
FIG. 12 is a block diagram schematically illustrating an embodiment of a processing unit in an A/D converter in accordance with the present invention.

FIG. 12 is a block diagram schematically illustrating an embodiment of a processing unit 20 in an A/D converter in accordance with the embodiment of FIG. 1. The output signals from the 3 photo detectors are forwarded to corresponding comparators 22. A common threshold TH from a threshold circuit 24 is subtracted from these input signals. A clock generator 26 generates a common clock signal CL for these 3 comparators 22, and each clock pulse will trigger parallel sampling of the sign of the difference between the two input signals to each comparator 22. If the difference is positive, this indicates that the corresponding photo detector 18 is illuminated and results in a bit having the value "1". A negative difference results in a "0" bit. The resulting Gray code at the output of processing unit 20 may be translated into ordinary binary code by a simple table look-up.

Figure 13:
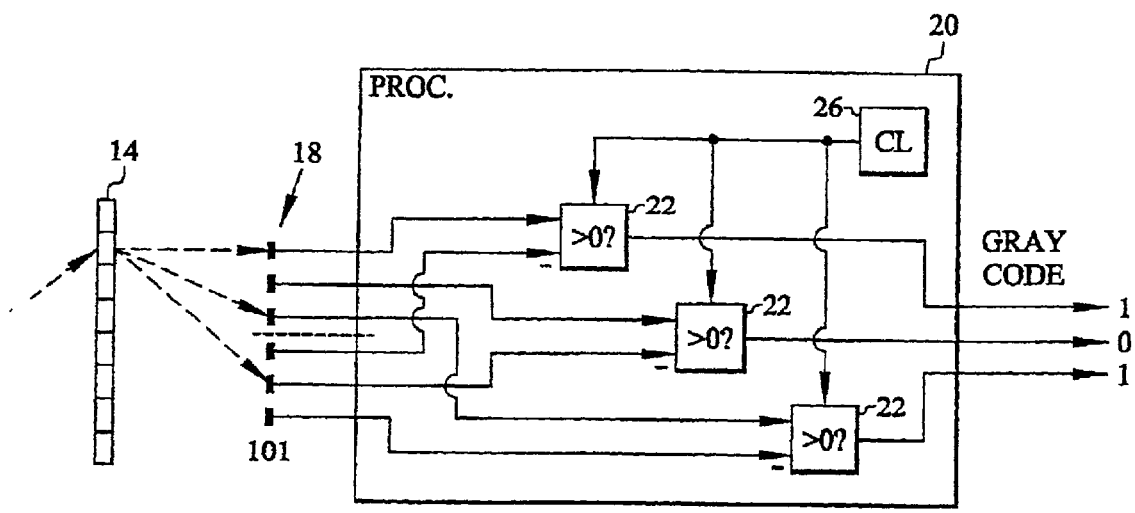
FIG. 13 is a block diagram schematically illustrating another embodiment of a processing unit in an A/D converter in accordance with the present invention.

FIG. 13 is a block diagram schematically illustrating another embodiment of a processing unit 20 in an A/D converter in accordance with the embodiment of FIG. 3. This embodiment of the processing unit 20 differs from the embodiment of FIG. 12 by the threshold arrangement. In this case the threshold to each comparator 22 is formed by the output signal from the corresponding complementary photo detector. Thus, if the output signal from a photo detector in the upper part of the set 18 (above the dashed line) is stronger than the output signal from its corresponding "2-complement" photo detector in the lower part of the set, this will result in an output bit having the value 1. In the opposite case the result will be a bit having the value 0. This embodiment is characterized in that the threshold is individual for each bit and also dynamic.

Figure 14:
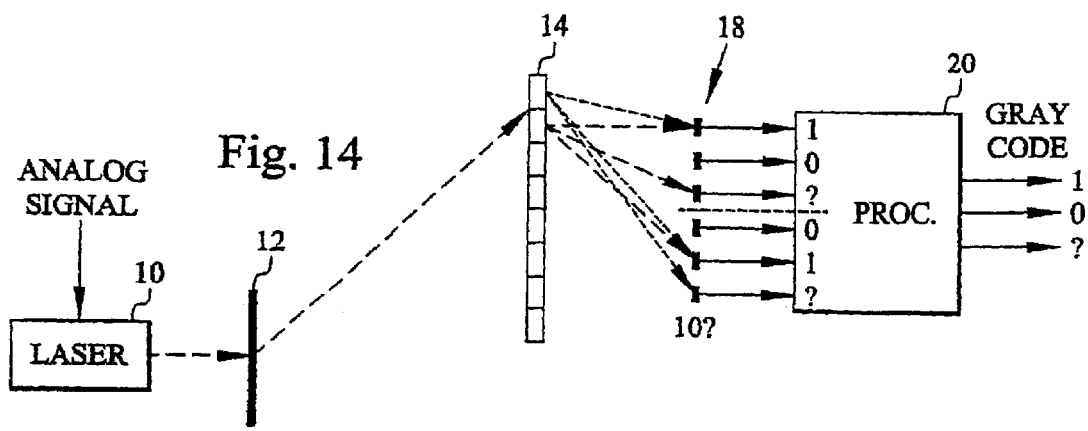
FIG. 14 illustrates the behavior of the embodiment of FIG. 3 when the analog value lies near or on the border between two digital values.

As noted above it is preferable to digitize the analog signal into Gray code instead of ordinary binary code due to the graceful behavior of Gray code during transitions from one digitized value to a neighboring value. FIG. 14 illustrates the behavior of the embodiment of FIG. 3 when the analog value lies near or on the border between two digital values. Since the deflected beam has a certain width, it will illuminate two diffractive elements in this case. Thus, in FIG. 14 the diffraction patterns from both FIGS. 10 and 11 will be activated. In this case this means that the uppermost photo detector will be illuminated by both patterns. The same comment applies to the middle photo detector in the complementary part of set 18. This means that the two upper bits (1 and 0, respectively) are still certain. However, the lowest photo detector in the upper part and its corresponding complementary photo detector in the lower part are now both illuminated, which makes the third bit uncertain. The outcome will depend on which detector has the strongest output signal. However, FIG. 14 illustrates the fact that only one bit will be uncertain in these border line cases. The result is the same for all the other border line cases and may also be generalized to n bit A/D converters.

Figure 15:
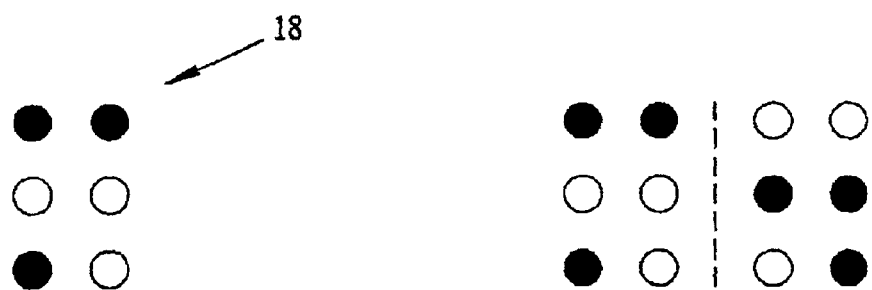
FIG. 15 illustrates an embodiment of a 2-dimensional photo detector arrangement for an A/D converter in accordance with the present invention.

In order to describe the principles of the present invention, a 1-dimensional photo detector arrangement has been assumed. However, in practice a 2-dimensional arrangement may be preferable. FIG. 15 illustrates an embodiment of a 2-dimensional photo detector arrangement suitable for an A/D converter operating in accordance with the embodiment of FIG. 1. The illustrated arrangement is intended for an A/D converter with a resolution of 6 bits. Filled circles represent illuminated photo detectors, while unfilled circles represent non-illuminated photo detectors.

Figure 16:
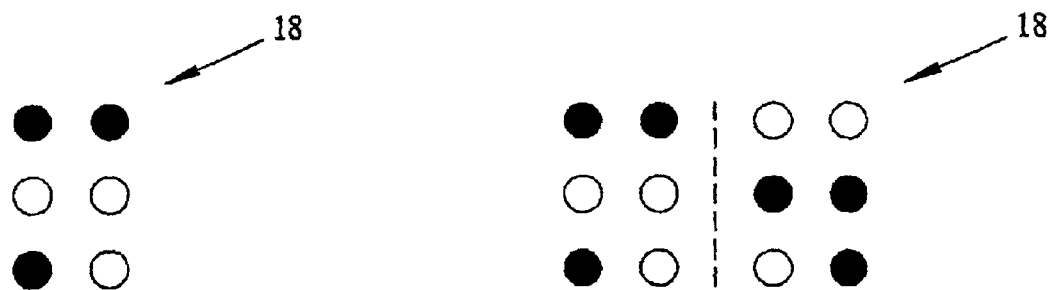
FIG. 16 illustrates another embodiment of a 2-dimensional photo detector arrangement for an A/D converter in accordance with the present invention.

FIG. 16 illustrates another embodiment of a 2-imensional photo detector arrangement suitable for an A/D converter operating in accordance with the embodiment of FIG. 3. It is noted that the left half of FIG. 16 is identical to the embodiment of FIG. 15, while the right half forms the complementary part.

Figure 17:
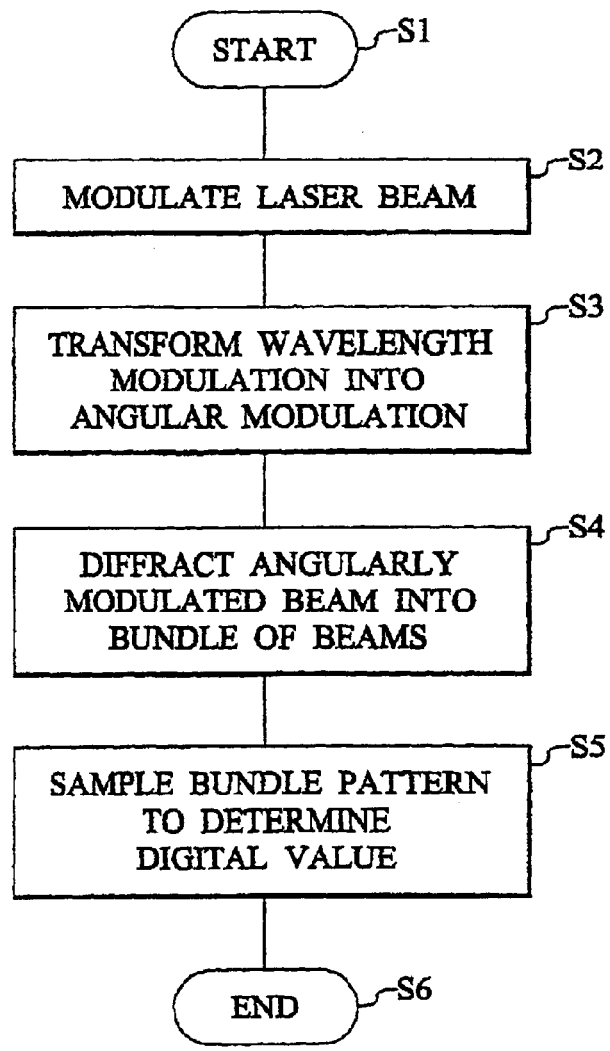
FIG. 17 is a flow chart illustrating the A/D conversion method in accordance with the present invention.

FIG. 17 is a flow chart illustrating the A/D conversion method in accordance with the present invention. The procedure starts in step S1. Step S2 modulates the wavelength of the laser beam by a monotonic function of the analog signal. In step S3 the wavelength modulation is transformed into an angular modulation by grating 12. Step S4 diffracts the deflected beam into a bundle of beams having a pattern that is characteristic of the impinged diffractive element. Step S5 samples the bundle pattern to determine the corresponding digital value. This ends the digitalization in step S6. This procedure is repeated for each new sample.

Typical values of critical parameters are: The laser wavelength (before modulation) is typically of the order of 1–2 μm. The total wavelength variation is typically of the order of 0.1–0.2 μm. These ranges will allow a digital resolution of the order of 6–8 bits at a sampling rate of the order of 1–100 Giga samples per second (depending on the desired resolution).

Grating 12 should preferably produce a large deflection of the laser beam for a small wavelength shift. An example of such gratings are arrayed waveguide gratings, see [7]. By using an arrayed waveguide grating, waveguide diffractive elements as well as waveguide detectors and a laser wavelength of e.g. 0.8 μm, it is possible to integrate the entire A/D converter, with the exception of the laser, monolithically on silicone. By using e.g. InP it is possible to integrate the entire converter in one chip. Very compact arrayed waveguide gratings have been demonstrated in InP.

It will be understood by those skilled in the art that various modifications and changes may be made to the present invention without departure from the scope thereof, which is defined by the appended claims.

REFERENCES

[1] F. J. Leonberger, C. E. Woodward, C. A. Becker, "4-bit 828-mega-sample/s electro-optic guided-wave analog-to-digital converter", Applied-Physics-Letters, Vol.40, No.7, 1 April 1982, pp.565–568.

[2] Y. Tsunoda et. al., "Combined optical A/D conversion and page composition for holographic memory applications", Applied Optics, 18, No. 10, October 1977, pp. 2607–2609.

[3] A. S. Bhushan et. al., "150 Gsample/s wavelength division sampler with time-stretched output", ELECTRONICS LETTERS, Mar. 5, 1988, No. 5, pp. 474–475.

[4] Rigole P -J., Nilsson S., Berglind E., Blumenthal D. J. and Shell M.: "State-of-the-art: Widely tunable lasers", Invited paper at the In-Plane Semiconductor Lasers: from Ultraviolet to Mid-Infrared, SPIE's international symposium, Optoelectronics '97, pp 382–393, San Jose, February 1997

[5] L. B. Lesem et. al., "The Kinoform: A New Wavefront Reconstruction Device", IBM J.Res. Develop. 13, pp. 149–155.

[6] M. Larsson et. al., "Successive development optimization of resist kinoforms manufactured with direct-writing, electron-beam lithography", Applied Optics, Vol. 33, March 1994, pp. 1176–1179.

[7] Okamoto K.: "Fundamentals, technology and applications of AWGs", Proceedings of the European Conference on Optical Communication 1998 (ECOC'98), Vol. 2, pp 7–47, Madrid, Spain, 1998

What is claimed is:

1. An opto-electronic method of converting an analog signal into a digital signal, comprising the steps of:

wavelength modulating a narrowband coherent electromagnetic beam such that the wavelength variation is a monotonic function of the amplitude of said analog signal;

transforming said wavelength modulated beam into a corresponding angularly modulated beam;

diffracting said angularly modulated beam into a bundle of diffracted beams; and determining said digital signal by repeatedly sampling the spatial power distribution of said diffracted beams.

2. The method of claim 1, wherein said digital signal is determined in Gray coded form.

3. An opto-electronic apparatus for converting an analog signal into a digital signal, comprising:

means for wavelength modulating a narrowband coherent electromagnetic beam by a monotonic function of the amplitude of said analog signal;

means for transforming said wavelength modulated beam into a corresponding angularly modulated beam;

means for diffracting said angularly modulated beam into a bundle of diffracted beams; and means for determining said digital signal by repeatedly sampling the spatial power distribution of said diffracted beams.

4. Th apparatus of claim 3, wherein said wavelength modulating means include a tunable laser.

5. The apparatus of claim 3, wherein said transforming means include a grating.

6. The apparatus of claim 5, wherein said transforming means include an arrayed waveguide grating.

7. The apparatus of claims 3, wherein said diffracting means includes a set of diffracting elements.

8. The apparatus of claim 7, wherein said determining means includes a set of photo detectors.

9. The apparatus of claim 8, wherein said diffraction means includes $2^n$ diffraction elements, where n is a positive integer representing the digital resolution of the apparatus.

10. The apparatus of claim 9, wherein said determining means includes n photo detectors.

11. The apparatus of claim 9, wherein said determining means includes 2n photo detectors for determining both said digital signal and its 2-complement.

12. The apparatus of claim 3, wherein the determining means determines said digital signal in Gray coded form.

* * * * *